United States Patent [19]

Joyce et al.

[11] Patent Number: 5,326,710

[45] Date of Patent: Jul. 5, 1994

[54] PROCESS FOR FABRICATING LATERAL PNP TRANSISTOR STRUCTURE AND BICMOS IC

[75] Inventors: Christopher C. Joyce, Gorham; Murray J. Robinson, Falmouth, both of Me.

[73] Assignee: National Semiconductor Corporation, Santa Clara, Calif.

[21] Appl. No.: 942,977

[22] Filed: Sep. 10, 1992

[51] Int. Cl.$^5$ ........................................... H01L 21/265
[52] U.S. Cl. ......................................... 437/31; 437/32; 437/59; 437/26; 437/917; 148/DIG. 9
[58] Field of Search .................. 437/31, 32, 59, 26, 437/917; 148/DIG. 9, DIG. 10, DIG. 11

[56] References Cited

U.S. PATENT DOCUMENTS

| | | | |
|---|---|---|---|
| 5,150,177 | 9/1992 | Robinson et al. | 357/15 |
| 5,187,109 | 2/1993 | Cook et al. | 437/32 |
| 5,239,270 | 8/1993 | Desbiens | 324/719 |
| 5,256,582 | 10/1993 | Mosher et al. | 437/32 |
| 5,262,345 | 11/1993 | Nasser et al. | 437/59 |
| 5,268,312 | 12/1993 | Reuss et al. | 437/59 |
| 5,268,316 | 12/1993 | Robinson et al. | 437/59 |
| 5,290,718 | 3/1994 | Robinson et al. | 437/34 |

OTHER PUBLICATIONS

Murray J. Robinson, et al. U.S. patent application Ser. No. 655,676, filed Feb. 14, 1991 for Bipolar Transistor Structure and BICMOS IC Fabrication Process.

Primary Examiner—Brian E. Hearn
Assistant Examiner—Tuan Nguyen
Attorney, Agent, or Firm—Daniel H. Kane; Richard C. Calderwood; Stephen R. Robinson

[57] ABSTRACT

A lateral PNP transistor structure is fabricated in a BICMOS process utilizing the same steps as are used during the BICMOS process for fabricating NPN and CMOS transistors without requiring additional steps. A base N+ buried layer B/N+BL formed in the IC substrate P/SUB underlies the bipolar PNP transistor. A base Retro NWELL B/NWELL and a base contact Retro NWELL BC/NWELL are formed in the base N+ buried layer B/N+BL using the CMOS Retro NWELL mask, etch and N type introduction sequence. An epitaxial layer EPI of undoped or low doped EPI is deposited across the IC substrate and isolation oxide regions ISOX isolating the PNP transistor are grown during the isolation oxide ISOX mask, etch and grow sequence. The NPN collector sink definition mask, etch and N type introduction sequence is used to form a PNP base contact N+ sink region BC/N+SINK to the BC/NWELL and B/N+BL. A field oxide spacer FOX is grown during the CMOS active area definition mask, etch and grow sequence for separating the PNP BC/N+SINK from the PNP collector region P+C. A uniform layer of polysilicon POLY is masked and etched during the POLY definition mask and etch sequence to form a self aligned transistor SAT POLY mask for critically defining the PNP base width and base active region. The PNP collector region P+C and emitter region P+E are introduced through the SAT POLY mask using at least one of the NPN base definition mask, etch and P type introduction sequence and PMOS P+S/D mask definition, etch and P type introduction sequence. The PNP base contact region can be formed using the NPN emitter definition mask sequence. The PNP transistor contact surfaces and metal contacts are thereafter prepared according to conventional procedures.

20 Claims, 11 Drawing Sheets

PROCESS FOR FABRICATING LATERAL PNP TRANSISTOR STRUCTURE AND BICMOS IC

TECHNICAL FIELD

This invention relates to a new lateral active region PNP transistor structure with reduced parasitic capacitance, lower contact resistance, reduced geometry, tighter base width control, and higher speed. The invention also provides a new method of forming the lateral PNP transistor structure during a BICMOS process for fabricating bipolar NPN transistors and CMOS transistors including PMOS and NMOS transistors in a BICMOS integrated circuit. The invention utilizes the same steps in fabricating the lateral PNP transistor as are used during the BICMOS process for fabricating NPN and CMOS transistors without requiring additional steps.

BACKGROUND ART

A BICMOS IC fabrication process for fabricating both bipolar NPN and CMOS transistor structures recently in use at National Semiconductor Corporation, South Portland, Me. 04106 is summarized in TABLE I showing the overall BICMOS mask sequence. Further description of the BICMOS process mask sequence and sequence steps is also found in the Murray J. Robinson, Christopher C. Joyce, and Timwah Luk U.S. patent application Ser. No. 655,676 filed Feb. 14, 1991 for BIPOLAR TRANSISTOR STRUCTURE AND BICMOS IC FABRICATION PROCESS; the Robinson, Joyce, and Luk U.S. patent application Ser. No. 803,214 filed Dec. 6, 1991 for SCHOTTKY DIODE STRUCTURE AND FABRICATION PROCESS; the Donald J. Desbiens U.S. patent application Ser. No. 840,390 filed Feb. 24, 1992 for WAFER LEVEL RELIABILITY CONTACT TEST STRUCTURE; and the Robinson and Joyce U.S. patent application Ser. No. 905,772 filed Jun. 29, 1992 for SIMPLIFIED HIGH RELIABILITY GATE OXIDE PROCESS.

TABLE I

BICMOS WAFER FABRICATION MASK SEQUENCE

| Mask No. | Mask Function |
|---|---|
| 1.0 | N+ Buried Layer (N + BL) or NPN Buried Collector Layer (BCL) Mask |
| 2.0 | PMOS Retro NWELL Mask and NPN Retro SEC Mask |
| 3.0 | NMOS Retro PWELL Mask and Channel Stop (CHST) Mask |
| 4.0 | Isolation Oxide (ISOX) Mask |
| 5.0 | NPN Collector Sink (N + SINK) Definition Mask & ISOX Gettering Mask |
| 6.0 | CMOS Active Area Definition Mask (Active Mask) or Field Oxide (FOX) definition Mask & NPN Collector Base Surface Spacer (CBSS) Definition Mask |
| 7.0 | CMOS Active Strip Mask |
| 8.0 | Poly Gate (POLY) Definition Mask |
| 9.0 | NPN Base Definition Mask |
| 10.0 | 2nd CVD Nitride Layer Etch Mask and NPN Collector Base & Emitter Contact Definition Mask |
| 11.0 | NPN Emitter Definition Mask & Collector Sink Contact Mask (Self-Aligned Transistor SAT Mask) |
| 12.0 | PMOS P + S/D Source/Drain Mask |
| 13.0 | NMOS N + S/D Source/Drain Mask |
| 14.0 | CMOS Contact Definition Mask |
| 15.0 | METAL 1 (M1) Definition Mask |
| 16.0 | VIA Mask (Inter Layer Dielectric Mask) |
| 17.0 | METAL 2 (M2) Definition Mask |

TABLE I-continued

BICMOS WAFER FABRICATION MASK SEQUENCE

| Mask No. | Mask Function |
|---|---|
| 18.0 | Passivation Mask and Bond Pad Definition Mask |

A buried collector layer BCL for bipolar NPN transistors is formed typically in a P type substrate P/SUB using the 1.0 BCL or N+BL mask, etch, and N type dopant material introduction sequence at the beginning of the BICMOS wafer fabrication process. The 1.0 N+BL mask is provided by a photoresist layer formed with openings defining the N+ buried layers and exposing an initial oxide layer over the substrate P/SUB. Relatively slow diffusing N type antimony atoms are implanted in the P type substrate through the 1.0 mask openings and initial oxide layer to an N+ concentration. The 1.0 mask is removed and a new photoresist layer is then deposited to form the 2.0 Retro NWELL mask.

The 2.0 retro NWELL mask sequence provides the Retro NWELL definition mask, etch, and N type impurity ion introduction sequence through NWELL openings for the CMOS/PMOS transistor structures. At the same time, it also provides a subemitter collector (SEC) region definition mask, etch, and N type impurity ion introduction sequence through SEC openings for the bipolar NPN transistor structures. By way of example, an SEC opening in the 2.0 Retro NWELL mask is formed with a horizontal area of approximately 10% and preferably in the range of 10% to 20% of the horizontal cross section area of the BCL. Relatively fast diffusing phosphorous atoms are implanted in the substrate P/SUB to an N+ concentration level through the 2.0 mask openings. Phosphorous atoms are used for the N+ concentration implant of the SEC and NWELL regions for faster up diffusion during subsequent annealing steps as hereafter described to provide retrograde concentrations extending into the subsequently deposited epitaxial layer EPI.

The 3.0 Retro PWELL mask, etch, and P type dopant material introduction sequence is used for defining and introducing the Retro PWELL regions for the CMOS/NMOS transistor structures and the channel stop regions CHST adjacent to the bipolar transistor structures. Boron atoms are implanted to a P+ concentration level in the PWELL and CHST regions through the 3.0 Retro PWELL mask openings. A single crystal epitaxial layer EPI of lightly doped N type silicon at an N− concentration is then deposited uniformly over the BICMOS IC structure in a blanket epitaxial deposition without a mask. The localized retrograde concentrations RETRO of P and N type material are initiated by diffusion upward from the Retro PWELL and Retro NWELL into the epitaxial layer EPI. An epitaxial oxide layer EPIOX and a first chemical vapor deposition CVD nitride layer CVDSIN are formed over the EPI.

Isolation oxide regions ISOX are established around the bipolar transistor structures using the 4.0 isolation oxide mask, etch and isolation oxide grow sequence. The NPN collector sink regions CS or N+SINK are defined by introducing an N+ concentration of phosphorous atoms using the 5.0 sink definition mask, etch and N type impurity ion introduction sequence. The 5.0 N+SINK definition mask is also formed with openings for introducing phosphorous atoms as a gettering agent in the isolation oxide regions ISOX. A second uniform CVD nitride layer is deposited in a blanket chemical vapor deposition across the BICMOS structure.

The 6.0 active area definition mask or Active Mask is formed with openings for etching the second CVD nitride layer CVDSIN around the active regions of the CMOS transistor structures. The openings in the 6.0 photoresist active mask expose the epitaxial layer EPI for growing field oxide regions FOX for framing and isolating the PMOS and NMOS transistor structures. Field oxide FOX is grown during the subsequent field oxide grow oxidation step.

At the same time the 6.0 Active Mask, etch and field oxide grow sequence also functions as the collector base surface spacer region CBSS definition mask, etch, and CBSS oxide grow sequence for the bipolar NPN transistor structures. The 6.0 photoresist active area definition mask functioning as a CBSS mask exposes the EPI surface area between the collector and base of bipolar transistors for the CBSS. In the subsequent field oxidation step, the collector base surface spacer region CBSS between the collector and base of bipolar transistors is formed from field oxide FOX rather than isolation oxide.

In the 7.0 active strip mask, etch, CMOS transistor voltage threshold ($V_T$) adjust, and gate oxide grow sequence steps, the second CVD nitride layer is stripped except over the bipolar NPN transistor structures. Voltage threshold $V_T$ of CMOS transistors, is adjusted in a P type material introduction step. In a series of subsequent steps sometimes referred to as the gate oxide loop or gate oxide sequence, the active areas of the CMOS transistor structures are opened to expose the epitaxial silicon and to grow a gate oxide layer GOX. These steps are described in detail in U.S. patent application Ser. No. 905,772 for SIMPLIFIED HIGH RELIABILITY GATE OXIDE PROCESS referenced above.

Gate material polysilicon (POLY) is subsequently deposited uniformly in one or two layers. The 8.0 poly gate definition mask and etch steps critically define the gates for CMOS transistors using a photoresist layer and photolithographic stepper sequence. The POLY layer is etched leaving behind the POLY gates over the gate oxide layer of CMOS transistors. No POLY is left over the bipolar NPN transistors. A thin oxide layer referred to as a sealing oxide or spacer oxide is grown over the POLY gates. A lightly doped source and drain N type dopant material introduction sequence such as an N− concentration phosphorus implant initiates preparation of the profile of source and drain regions of CMOS transistors.

The 9.0 NPN base definition mask, etch and introduction sequence is used for defining and introducing P type boron atoms for the base B of the bipolar NPN transistor structures. The base is implanted through the second CVD nitride layer CVDSIN which functions as a base implant screen. The 10.0 nitride etch mask provides a collector C, base B and emitter E contact definition mask using the second CVD nitride layer and forming a self-aligned transistor (SAT) CVD nitride mask over the bipolar NPN transistor structures. The epitaxial oxide layer EPIOX remains over the bipolar NPN transistor structures with the CVD nitride SAT mask openings defining the collector, base and emitter contacts.

The 11.0 NPN emitter definition and collector sink contact mask is constructed to utilize the underlying CVD nitride SAT mask over the bipolar NPN transistor structures. The emitter region E and collector sink contact region is implanted to an N+ concentration level with N type arsenic atoms. While previous annealing steps have begun development of the retrograde concentration upward through the epitaxial layer EPI from the PWELL, NWELL, and the SEC regions, the subsequent emitter annealing step following implant of the NPN emitter and collector sink contact regions fully develops most of the retrograde concentration profile of dopant atoms.

The 12.0 P+S/D source/drain mask, etch and P type dopant material introduction sequence is used for forming the P+ concentration source and drain regions of the PMOS transistor structures. The 13.0 N+S/D source/drain mask, etch and N type impurity ion introduction sequence for the NMOS transistor elements provides an N+ phosphorus implant over the previous lightly doped drain N− phosphorus implant in the source and drain regions. The combination of the N− and N+ phosphorous implants develops a profiled lightly doped drain for the NMOS transistor elements of the CMOS transistor pairs to reduce occurrence of "hot electrons".

Following the source/drain mask, etch and dopant material introduction sequences for the NMOS and PMOS transistor elements of the CMOS transistor structure, a blanket low temperature oxide layer LTO is deposited over the BICMOS structure. The 14.0 CMOS contact definition mask and etch sequence removes the LTO over the CMOS metal contact areas and over the bipolar transistor structure. The SAT CVD nitride mask on the bipolar transistor structures defines the bipolar transistor metal contact areas. Platinum is deposited and sintered forming platinum silicide over the metal contact areas. Unsilicided platinum is removed in a field etch. In subsequent mask steps the first metal layer is deposited and then selectively etched using the 15.0 Metal 1 or M1 definition mask and etch sequence for defining M1 metal contacts, followed by blanket deposition of an interlayer dielectric (ILD). The ILD is masked and etched using the 16.0 VIA mask to define the locations of interlayer contacts followed by blanket deposition of the second metal layer. The 17.0 Metal 2 or M2 definition mask and etch sequence defines the M2 metal contacts. A passivation layer such as a PECVD oxynitride layer is deposited over the BICMOS structure and the final 18.0 passivation mask and etch sequence cuts holes in the PECVD layer for bond pads.

A conventional lateral PNP transistor is typically fabricated in a bipolar or BICMOS process optimized for the fabrication of NPN transistors. An N type buried layer N+BL is formed in the semiconductor material substrate to underlie the PNP transistor. An N type epitaxial layer with an N type material concentration in the range of 2E16/cc is grown over the N type buried layer. A PNP base contact is provided by an N+SINK region extending through the N type epitaxial layer to the N+ buried layer. In typical lateral PNP transistor structures, the active base region is provided by the N type epitaxial layer over the N+ buried layer enhanced by N type material diffusing upward into the doped epitaxial layer.

The collector and emitter regions of the lateral PNP transistor structure are fabricated in the epitaxial layer using a P type mask, etch and introduction sequence from the bipolar or BICMOS fabrication process flow. Typically the NPN transistor base definition mask, etch and P type introduction sequence is utilized to form the emitter and collector regions of the lateral PNP transistor spaced apart by the PNP active base region of the N type epitaxial layer.

The conventional lateral PNP structure and fabrication process causes unnecessarily high parasitic junction capacitance across the junction between the N+ buried layer and P type regions. This problematic parasitic junction capacitance occurs at the junction of the N+ buried layer N+BL and non-active areas of the P type regions of the EPI. A second disadvantage of the conventional PNP transistor construction is that the base contact through the N+SINK region is made on the perimeter of an annular PNP collector region or on the outside or opposite side of the collector region from the emitter region. The base contact region must therefore be junction isolated from the collector region to avoid junction breakdown outside the PNP active transistor region. The lateral PNP transistor therefore requires significant spacing and is a relatively large geometrical structure on the integrated circuit.

A third disadvantage of the conventional PNP transistor structure and process is that the NPN base definition mask, etch and P type introduction sequence used to establish the emitter and collector regions of the PNP transistor also establishes the base width of the PNP transistor. In most bipolar and BICMOS fabrication processes, the NPN transistor base definition mask is not a critically controlled mask. Control over the base width of the PNP transistors and therefore control over the performance parameters of the PNP transistors is also limited.

OBJECTS OF THE INVENTION

It is therefore an object of the present invention to provide a new lateral active region PNP transistor structure with reduced parasitic capacitance between the N+ buried layer N+BL and epitaxial layer EPI and with reduced geometry, particularly in the spacing between the PNP transistor base contact region N+BC and collector region P+C.

Another object of the invention is to provide a lateral PNP transistor structure and fabrication process affording critical control over the base width and therefore the performance characteristics of the lateral PNP devices. A related object of the invention is to provide higher concentration and shallow collector P+C and emitter P+E regions and lower contact resistance at the emitter and collector regions.

A further object of the invention is to provide a lateral PNP transistor IC fabrication process using existing steps for fabricating NPN and CMOS transistors in a BICMOS process without adding additional steps.

DISCLOSURE OF THE INVENTION

In order to accomplish these results the invention provides a new method of forming a lateral PNP transistor in a substrate of semiconductor material during a BICMOS process for fabricating bipolar NPN transistors and CMOS transistors in a BICMOS integrated circuit. The invention proceeds by forming a base N+ buried layer B/N+BL in the IC substrate to underlie the bipolar PNP transistor during the N type buried layer N+BL mask, etch and N type introduction sequence used to form a buried collector layer BCL for NPN transistors of the BICMOS IC. A base Retro NWELL B/NWELL and a base contact Retro NWELL BC/NWELL are formed in the base N type buried layer B/N+BL to underlie the active base region B and base contact region N+BC respectively of the bipolar PNP transistor. The B/NWELL and BC/NWELL are formed during the Retro NWELL mask, etch and N type introduction sequence used to form retro NWELL's in the IC substrate for PMOS transistors of the BICMOS IC. A fast diffusing N type material such as phosphorus is used for the Retro NWELL's.

Further steps include growing an epitaxial layer EPI of undoped or low doped EPI across the IC substrate including the area for the PNP transistor. The B/NWELL and BC/NWELL diffuse upward into the EPI forming retrograde concentrations RETRO. The method proceeds by growing isolation oxide for isolating the PNP transistor from bipolar NPN transistors and CMOS transistors. The isolation oxide ISOX is grown during an isolation oxide mask, etch and grow sequence of the BICMOS process used to isolate NPN transistors and CMOS transistors.

A PNP base contact N+SINK region BC/N+SINK is formed over the base contact Retro NWELL BC/NWELL during a sink definition mask, etch and N type introduction sequence of the BICMOS process used to form the NPN collector sink regions C/N+SINK through the epitaxial layer EPI to the buried collector layer BCL/N+BL of the bipolar NPN transistors. The fabrication process proceeds by separating the base contact N+SINK region BC/N+SINK from a collector region P+C of the PNP transistor by field oxide FOX during the active area definition or field oxide definition mask, etch and grow sequence of the BICMOS process. The field oxide FOX definition mask is normally used for framing CMOS transistors in field oxide FOX and isolating PMOS and NMOS transistors.

The collector P+C and emitter P+E regions of the bipolar PNP transistor are formed by using at least one of a NPN base definition mask, etch and P type introduction sequence of the BICMOS process used to form a base region of bipolar NPN transistors, and a P+S/D mask definition etch and P type introduction sequence of the BICMOS process used to form the source S and drain D of PMOS transistors and to enhance the base region B of bipolar NPN transistors. Metal contacts to the collector, emitter and base contact regions of the PNP transistors are formed according to conventional procedures.

In the preferred example the process proceeds by depositing a uniform layer of polycrystalline semiconductor material POLY across the integrated circuit after the field oxide definition mask, etch and grow sequence; and forming a PNP base width definition and active base region definition self aligned transistor SAT mask of POLY using the POLY definition mask and etch sequence for CMOS transistors.

The collector P+C and emitter P+E regions of the lateral PNP transistor structures are then formed using at least one or both of the NPN base definition mask, etch and P type introduction sequence and the PMOS P+S/D mask definition, etch and P type introduction sequence, introducing the P type material through the POLY SAT MASK defining the PNP base width and active base region B between the collector P+C and emitter P+E regions.

A base contact region N+BC outside the collector region of the PNP transistor is then formed using the NPN emitter definition mask, etch and N type introduction sequence after forming the PNP collector and emitter regions in the previous sequence.

A feature of the present invention is growing the epitaxial layer EPI from no doped or low doped EPI, that is growing an epitaxial layer of silicon with only background doping of N type material in the concentration range of 1-3E15/cc in contrast to the typical higher concentration N type epitaxial layer in the concentration range of 2-3E16/cc. Compensation for the low carrier concentration epitaxial layer is provided locally by the PNP base Retro NWELL B/NWELL and base contact Retro NWELL BC/NWELL which diffuse upward into the epitaxial layer to provide a desirably higher concentration of N type carriers only in the active base region and base contact region of the PNP transistor. As a result, the parasitic junction capacitance between the N+ buried layer N+BL and epitaxial layer EPI of the PNP transistor is greatly reduced outside the active base region B and base contact regions N+BC and BC/N+SINK.

Another advantage of the present invention is that the POLY definition mask and etch sequence is the most tightly controlled mask sequence of the CMOS transistor fabrication steps because it is used to define the POLY gate widths and channel widths of the CMOS transistors. As a result the present invention provides critical control over the base width and therefore operating parameters of the lateral PNP transistors.

According to another feature of the invention the base contact N+SINK region BC/N+SINK and base contact layer N+BC are separated from the collector region P+C on the outside of the perimeter of the lateral PNP transistor collector region P+C by a field oxide FOX spacer region rather than by junction isolation. As a result the spacing requirements are greatly reduced along with the overall geometry of the PNP transistor.

In conventional BICMOS processes, an active strip mask, etch, $V_T$ adjust and gate oxide grow sequence are used for preparing the active area of CMOS transistors after the active area definition or FOX definition mask etch and grow sequence. Prior to the active strip mask, etch, $V_T$ adjust and gate oxide grow sequence the epitaxial layer is prepared by growing an epitaxial oxide layer EPIOX across the epitaxial layer EPI and depositing a second silicon nitride layer CVDSIN by chemical vapor deposition over the epitaxial oxide layer EPIOX. According to the present invention the steps provide for masking and covering the active area of the lateral PNP transistor including the emitter, base, collector and base contact regions of the PNP transistor during the active strip mask, etch, $V_T$ adjust and gate oxide grow sequence. The process of the invention therefore preserves the silicon nitride layer CVDSIN across the active areas of the lateral PNP transistor for protecting the lateral PNP transistor during the $V_T$ adjust implant.

The result of the new lateral PNP transistor BICMOS IC fabrication process is an improved lateral PNP transistor for BICMOS integrated circuits. The elements of the new transistor include a base N type buried layer B/N+BL underlying the active area of the PNP transistor in a substrate P/SUB of the BICMOS IC and a base Retro NWELL B/NWELL and base contact Retro NWELL BC/NWELL formed in the base N type buried layer B/N+BL underlying the respective active base region B and base contact region N+BC and BC/N+SINK of the bipolar PNP transistor. An epitaxial layer EPI of undoped or low doped epitaxial semiconductor material overlies the substrate. The base Retro NWELL B/NWELL and base contact NWELL BC/NWELL form retrograde concentrations of N type material upward through the epitaxial layer EPI.

A base contact N+SINK region BC/N+SINK overlies the base contact NWELL BC/NWELL for electrical contact to the active base region B through the base contact NWELL BC/NWELL, base N type buried layer B/N+BL, and base NWELL B/NWELL. A P type emitter region P+E and a P type collector region P+C are formed on either side of the active base region B which is formed by the retrograde concentration upward of the N type material from the base NWELL B/NWELL. A field oxide spacer region FOX at the surface of the epitaxial layer EPI separates the base contact N+SINK region BC/N+SINK and base contact N+BC from the P type collector region P+C on the outside of a perimeter of the collector region reducing the geometry of the lateral PNP transistor.

According to the invention a self aligned transistor SAT mask of polycrystalline semiconductor material POLY remains over the active area of the lateral PNP transistor defining the base width of the active base region B.

In the preferred example the lateral PNP transistor structure is formed in an annular concentric configuration comprising a collector region P+C in the configuration of an outer annulus, an active base region B in the configuration of an intermediate annulus inside the outer annulus of the collector region P+C, and an emitter region P+C in the configuration of an area inside the intermediate annulus of the active base region B. The base contact region N+BC and base contact sink region BC/N+SINK are positioned adjacent to the outside of the outer annulus of the collector region P+C and spaced from the collector region P+C by the field oxide spacer FOX.

Other objects, features and advantages of the invention are apparent in the following specification and accompanying drawings.

BRIEF DESCRIPTION OF THE DRAWINGS

FIG. 9 is a simplified diagrammatic side cross section of the completed lateral PNP transistor structure while

DESCRIPTION OF PREFERRED EXAMPLE EMBODIMENTS AND BEST MODE OF THE INVENTION

Figure 1:
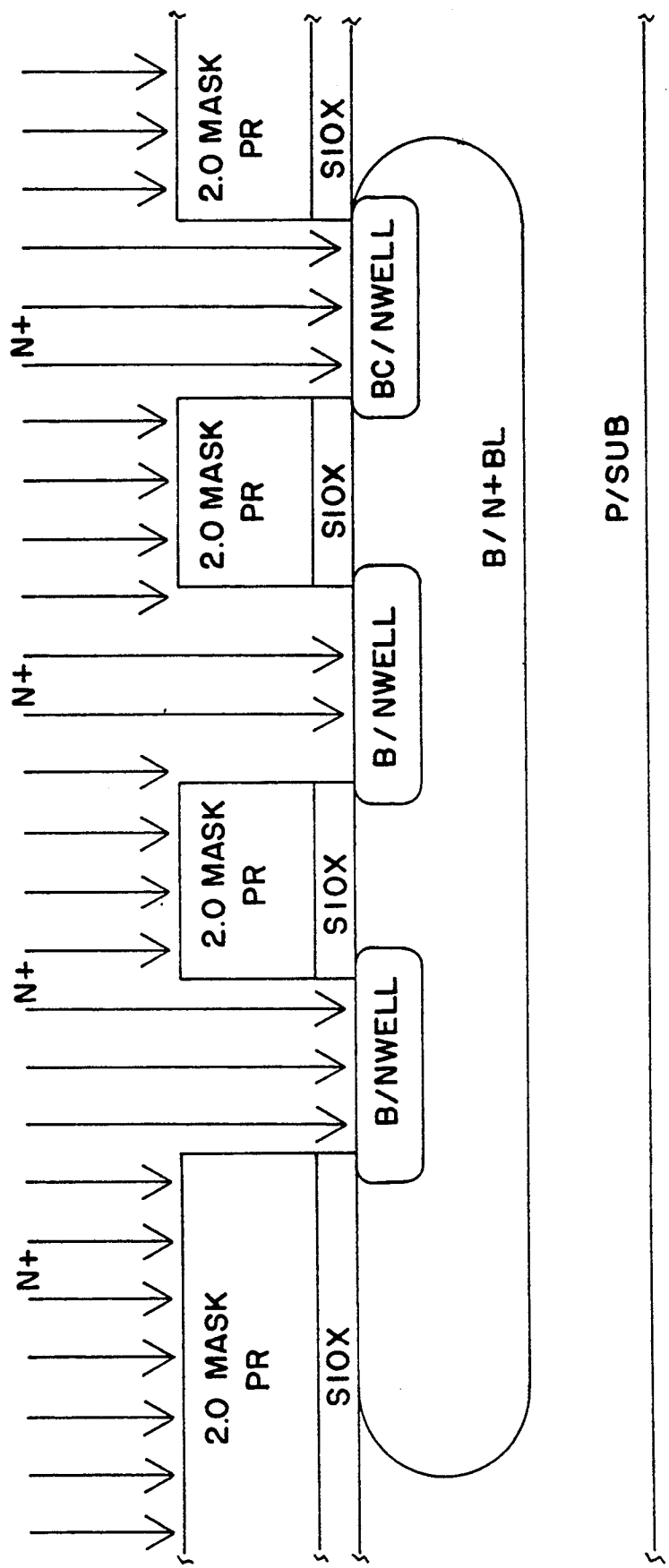
FIG. 1 is a simplified diagrammatic side cross section through the lateral PNP transistor structure in process of fabrication during the 2.0 Retro NWELL mask, etch and N type introduction sequence of the new BICMOS process.

The BICMOS process for fabricating the lateral PNP transistor and the lateral PNP transistor structure are illustrated in FIGS. 1-10. As shown in FIG. 1 the PNP base Retro NWELL B/NWELL and base contact Retro NWELL BC/NWELL are formed by a relatively fast diffusing phosphorus implant to an N+ concentration in the base N+ buried layer B/N+BL. The N+ phosphorus implant takes place through the openings of the 2.0 Retro NWELL mask photoresist PR and corresponding openings previously etched in the initial oxide layer SIOX formed over the substrate P/SUB. The base N+ buried layer B/N+BL was previously formed in the substrate P/SUB by an N+ concentration implant of antimony through a PNP B/N+BL opening of the 1.0 N+BL mask (NPN BCL mask) not shown. As used in the specification and claims, the designations P and N refer to the carrier type dopant material atoms while the sign —, no sign, and + refer to the relative concentration of the P or N type ions or atoms.

Figure 2:
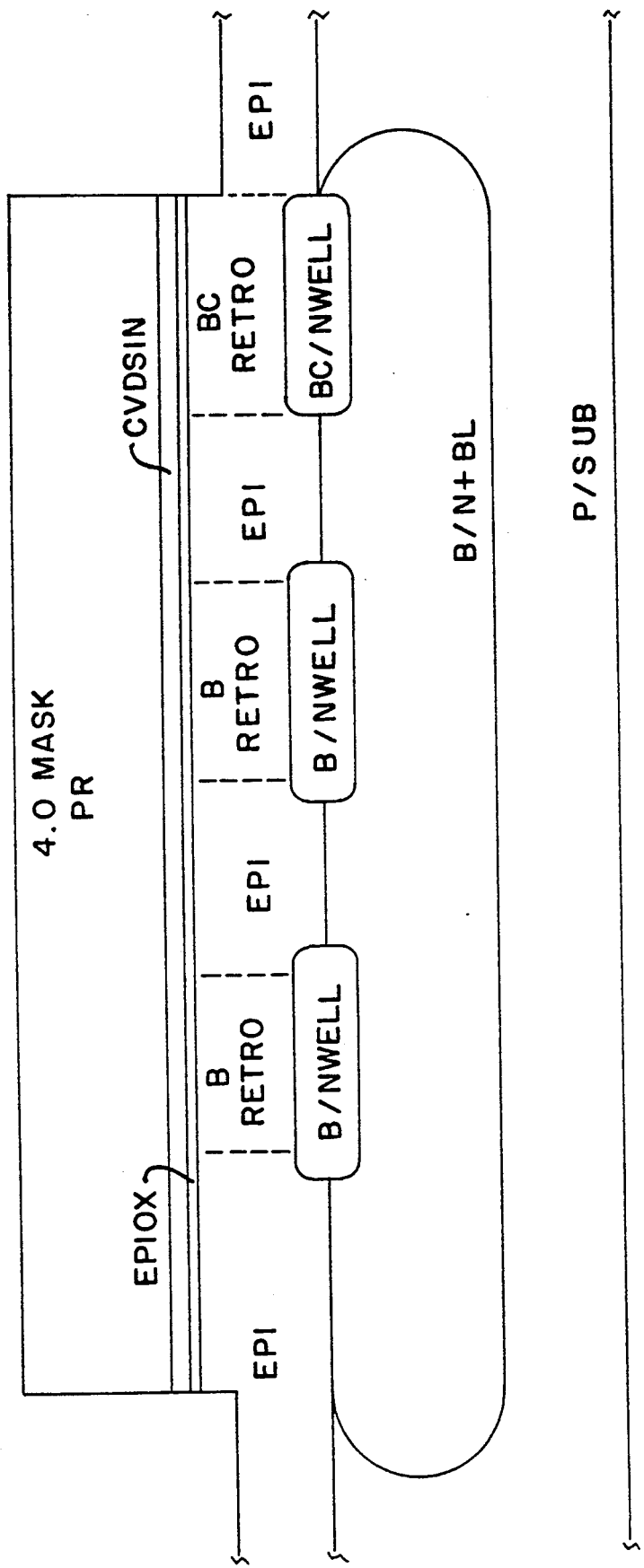
FIG. 2 is a simplified diagrammatic side cross section view through the lateral PNP structure in process of fabrication during the 4.0 isolation oxide ISOX mask, etch and ISOX grow sequence.

An epitaxial layer EPI is deposited over the substrate P/SUB. The epitaxial silicon is undoped or doped only with a background concentration of 1-3E15/cc N type atoms, an order of magnitude lower concentration than the conventional N type epitaxial silicon having an N type concentration in the range of 1-3E16/cc. An epitaxial oxide layer EPIOX is grown over the epitaxial layer EPI and a first silicon nitride layer CVDSIN is deposited over the EPIOX layer by chemical vapor deposition. As shown in FIG. 2, the EPI, EPIOX and CVDSIN layers are etched using the 4.0 isolation oxide mask for growing isolation oxide ISOX shown in FIG. 3.

During epitaxial deposition of the epitaxial layer EPI, the relatively fast diffusing phosphorus atoms of the B/NWELL and BC/NWELL begin diffusing upward to form the retrograde concentration RETRO of N type atoms in the active base region B and base contact region BC as shown in FIG. 2. The retrograde concentration RETRO continues to develop during subsequent annealing steps providing the desired concentration of carriers in the active base region B and base contact region BC while the nonactive regions of the epitaxial layer EPI remain relatively nonconducting. As a result the parasitic capacitance between the base N+ buried layer B/N+BL and epitaxial EPI is greatly reduced.

Figure 3:
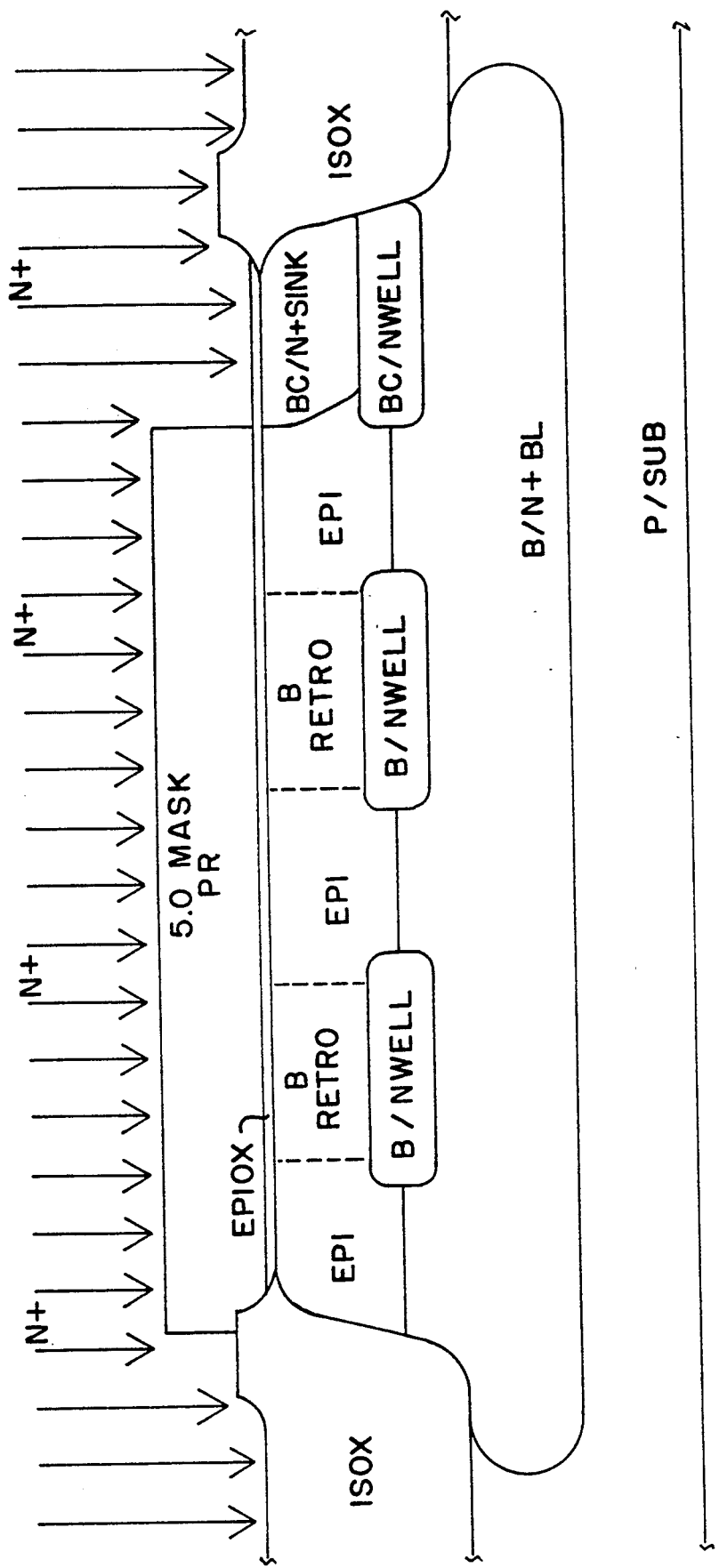
FIG. 3 is a simplified diagrammatic side cross section through the lateral PNP transistor structure in process of fabrication during the 5.0 N+SINK definition mask, etch and introduction sequence.
Figure 4:
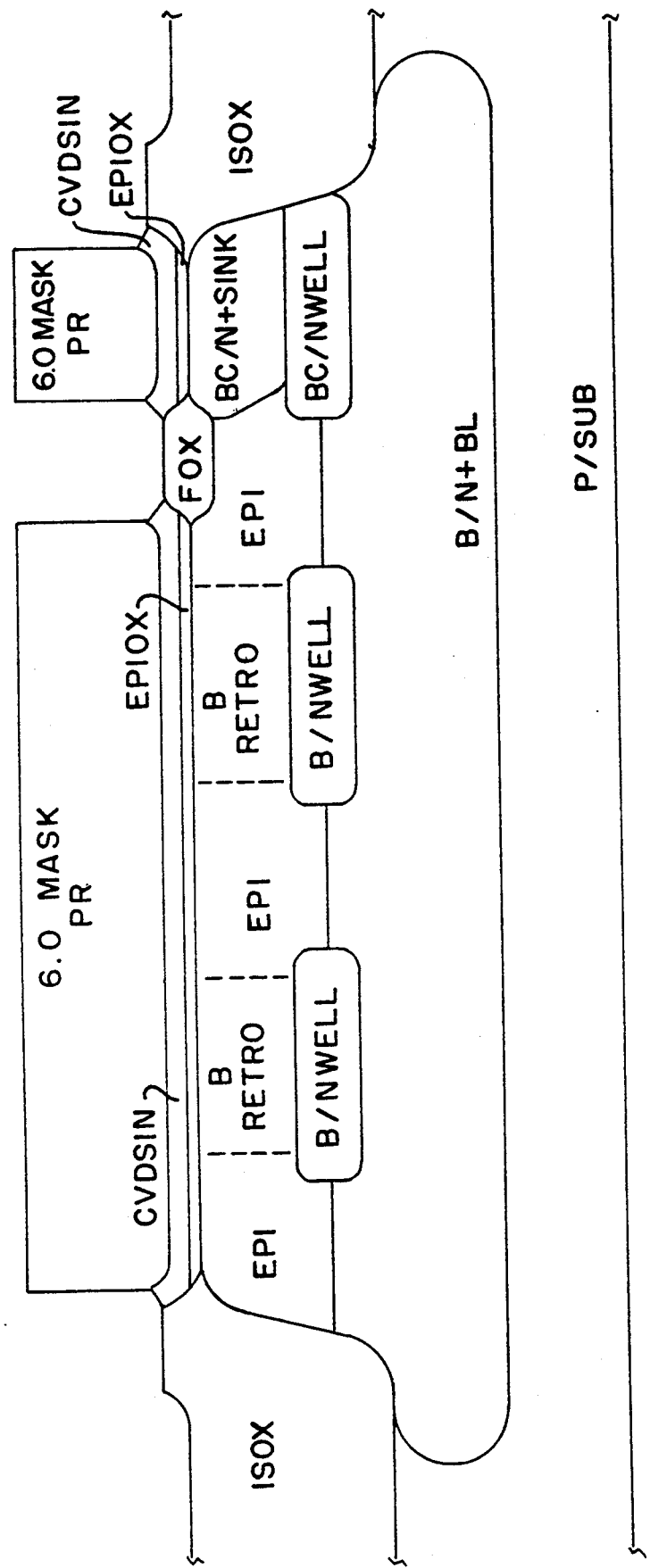
FIG. 4 is a simplified diagrammatic side cross section through the lateral PNP transistor structure in process of fabrication during the 6.0 CMOS active area definition mask, etch and FOX grow sequence.

A PNP base contact N+ sink region BC/N+SINK is formed over the BC/NWELL by an N+ concentration implant of phosphorus through openings formed in the 5.0 sink definition mask which also provides a gettering implant in the isolation regions ISOX as shown in FIG. 3. The first CVDSIN layer is removed prior to the 5.0 mask, etch and implant sequence and a second nitride layer CVDSIN is deposited by chemical vapor deposition. The second CVDSIN layer is masked and etched using the 6.0 active area definition mask and etch sequence to expose a spacer region between the base contact N+ sink region BC/N+SINK and the PNP collector region to be formed. Field oxide is grown in the exposed areas providing the field oxide spacer FOX between the PNP base contact and collector as shown in FIG. 4.

Figure 5:
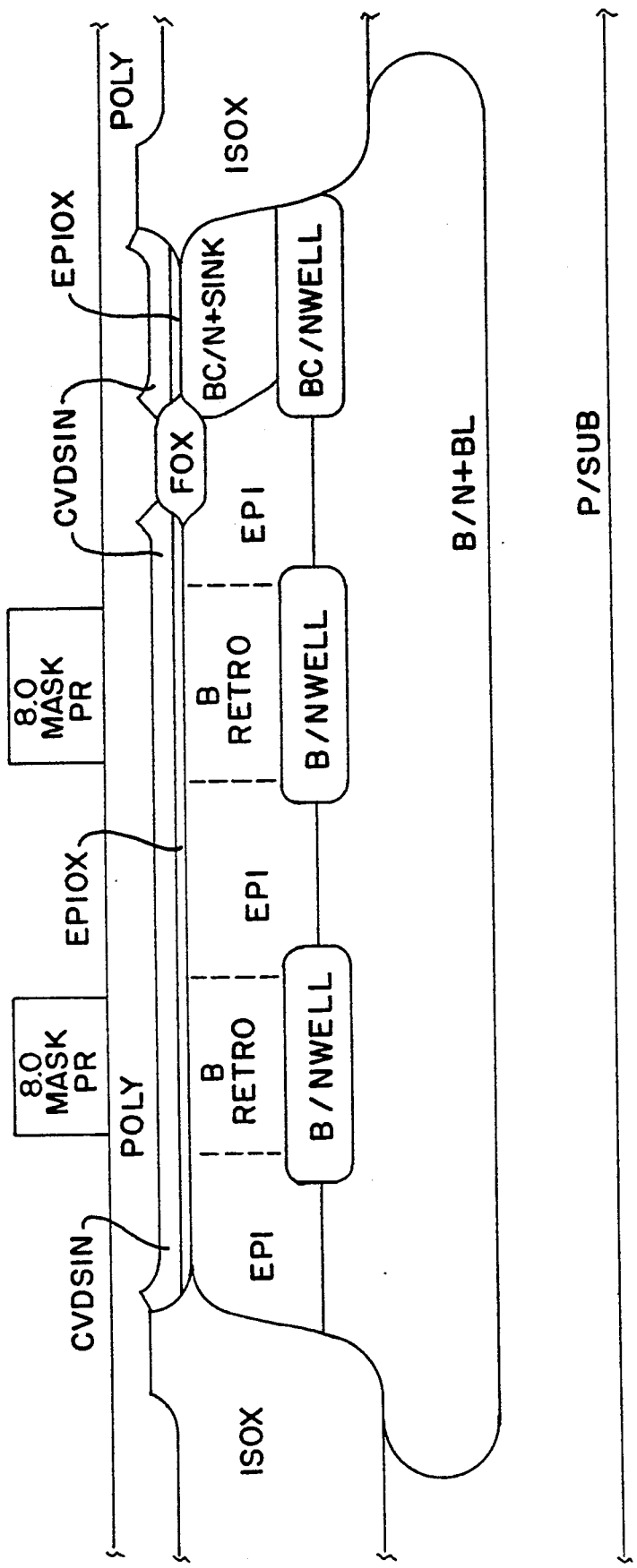
FIG. 5 is a simplified diagrammatic side cross section through the lateral PNP transistor in process of fabrication during the 8.0 POLY gate definition mask and etch sequence forming the POLY SAT PNP base width definition mask.
Figure 6:
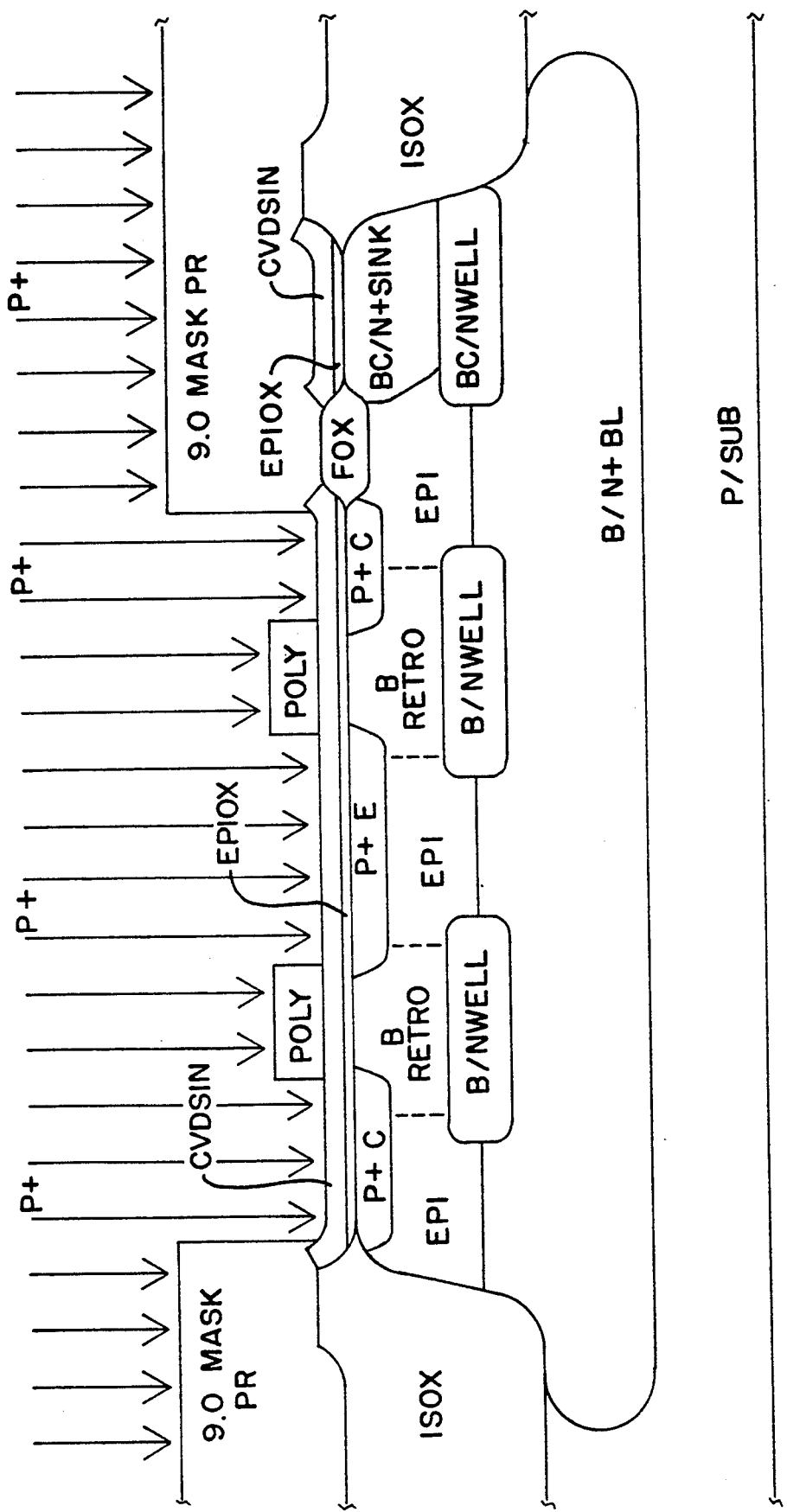
FIG. 6 is a simplified diagrammatic side cross section of the lateral PNP transistor structure in process of fabrication during the 9.0 NPN base definition mask, etch and P type introduction sequence.

A polycrystalline silicon layer POLY is deposited over the evolving lateral PNP transistor structure as shown in FIG. 5. The 8.0 POLY definition mask is prepared as shown in FIG. 5 for masking and etching the POLY layer over the active region of the lateral PNP transistor to leave a highly defined POLY self aligned transistor SAT mask over the PNP active region as shown in FIG. 6. The SAT POLY mask performs no electrical function and remains on the PNP structure as a highly defined SAT POLY mask for critically controlling the base width of the PNP transistor as hereafter described. As shown in FIG. 6 the 9.0 NPN base definition mask is formed with an opening over the active region of the PNP transistor so that the SAT POLY mask provides the PNP collector region and emitter region definition mask. The P+ concentration implant of boron which forms the base of NPN transistors initiates the formation of the collector region P+C and emitter region P+E of the PNP transistor as further shown in FIG. 6.

Figure 8:
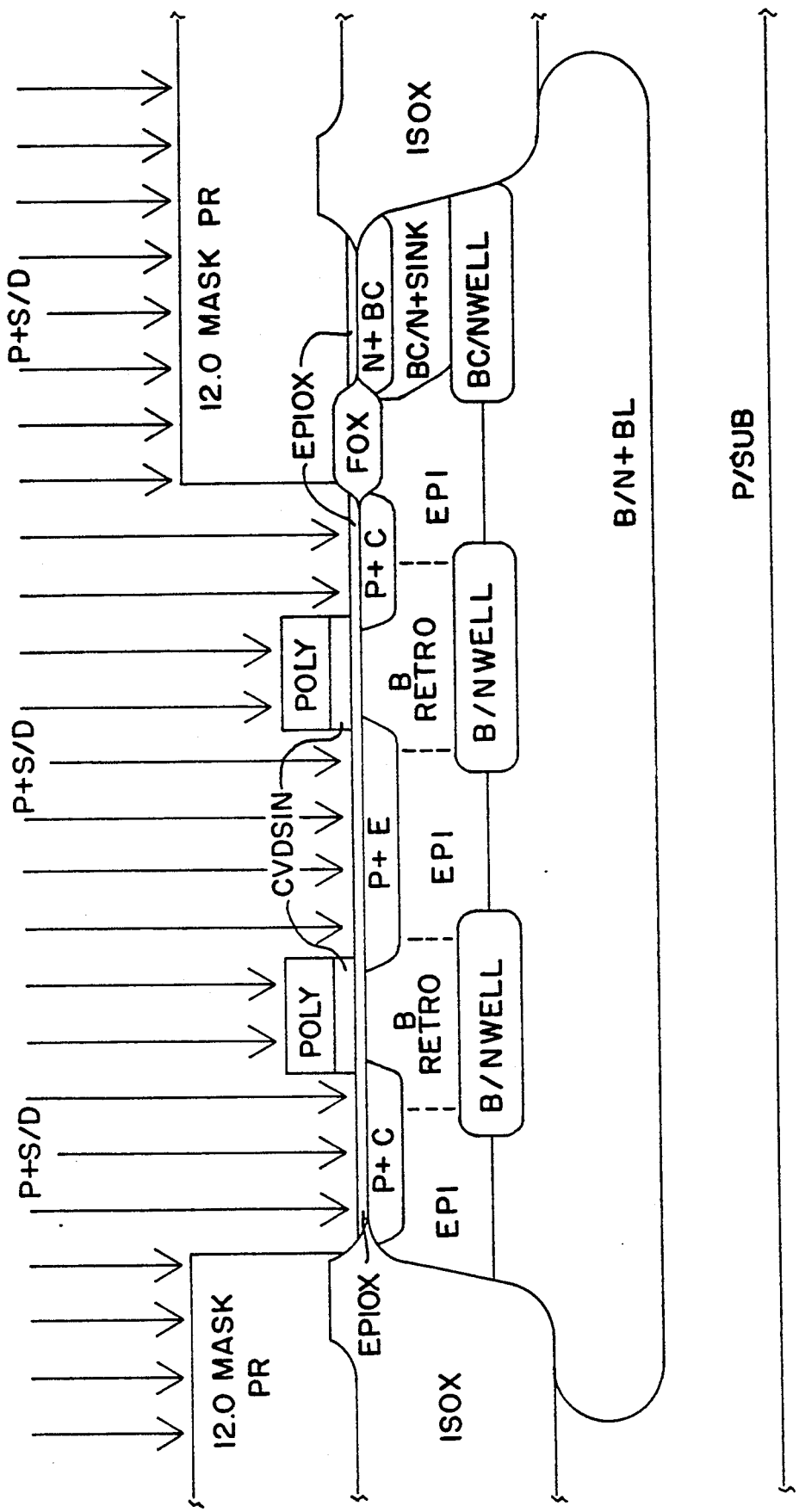
FIG. 8 is a simplified diagrammatic side cross section of the lateral PNP transistor structure in process during the 12.0 PMOS P+S/D source/drain mask, etch and P type introduction sequence.

The collector region P+C and emitter region P+C of the PNP transistor may be further developed during the subsequent 12.0 PMOS P+S/D mask, etch and implant sequence. In that case the 12.0 mask is formed with an opening over the active region of the PNP transistor as shown in FIG. 8. Alternatively, the PNP collector and emitter regions P+C, P+E are formed by the PMOS P+S/D implant alone without the NPN base implant of FIG. 6. An advantage of the 12.0 mask P+S/D implant either alone or in combination with the 9.0 mask P+ implant is that it provides a relatively shallow high concentration region at the surface with low contact resistance.

Figure 7:
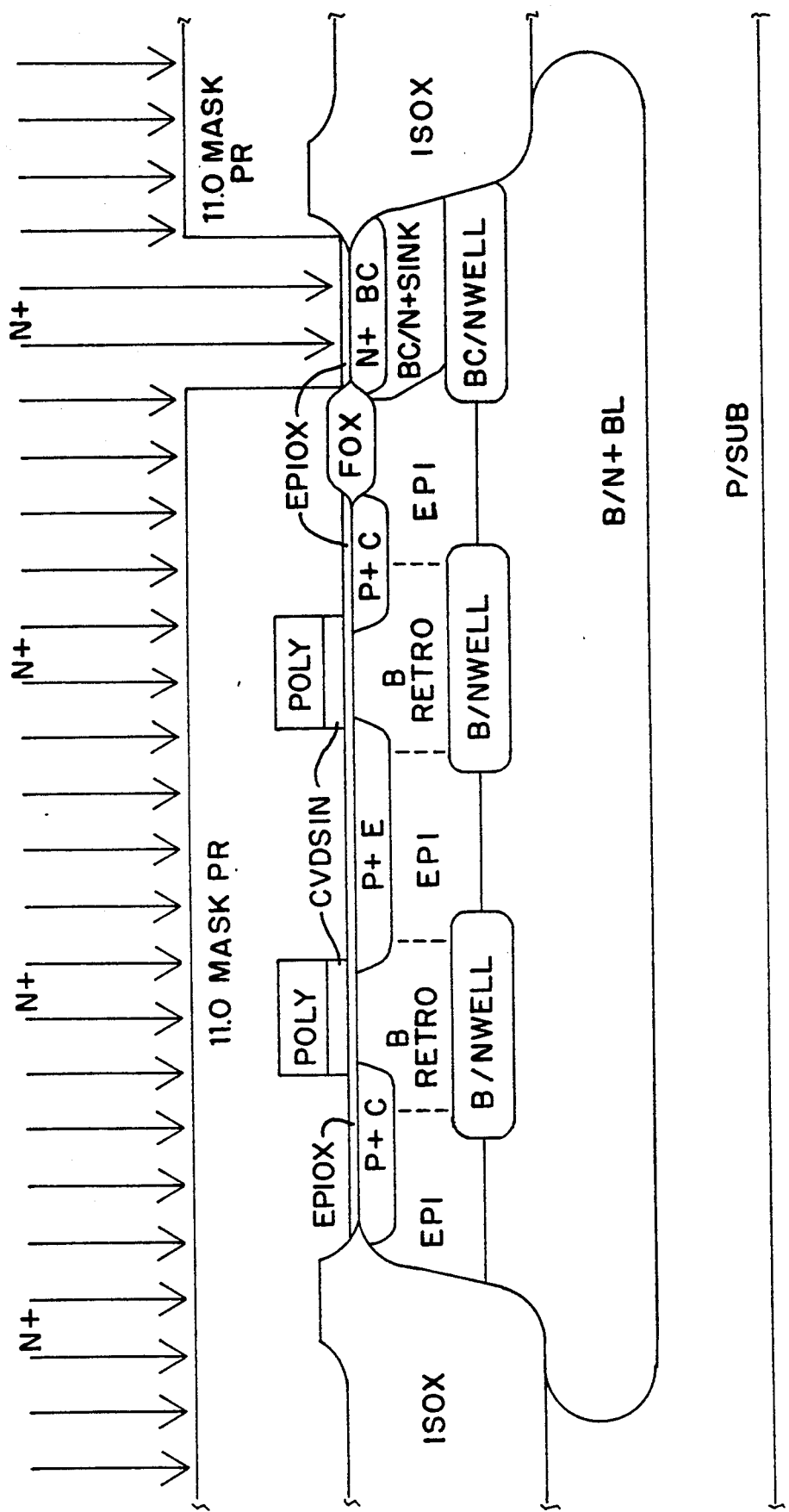
FIG. 7 is a simplified diagrammatic side cross section of the lateral PNP transistor structure in process during the 11.0 NPN emitter definition mask, etch and N type introduction sequence.

Prior to the 12.0 mask P+S/D implant, a high concentration N+ base contact N+BC is formed over the BC/N+SINK by an N+ concentration implant through an opening formed in the 11.0 NPN emitter definition mask as shown in FIG. 7. Appropriate contact surfaces and metal contacts are then formed according to conventional steps not shown. The lateral PNP transistor structure with schematic electrical contacts is shown diagrammatically in FIG. 9. The layout of the lateral PNP transistor structure is further shown in FIG. 10. The metal 1 layer collector contact M1(CC) is formed through the low temperature oxide overlying the collector region C(LTO) in the configuration of an outer ring or annulus. The SAT POLY mask overlies the active base region in the configuration of an intermediate ring or annulus. The metal 1 emitter contact layer M1(CC) is formed through the low temperature deposited oxide overlying the central emitter region E(LTO). The metal base contact M1(BC) is formed through the low temperature deposited oxide overlying the base contact region BC(LTO).

Figure 9:
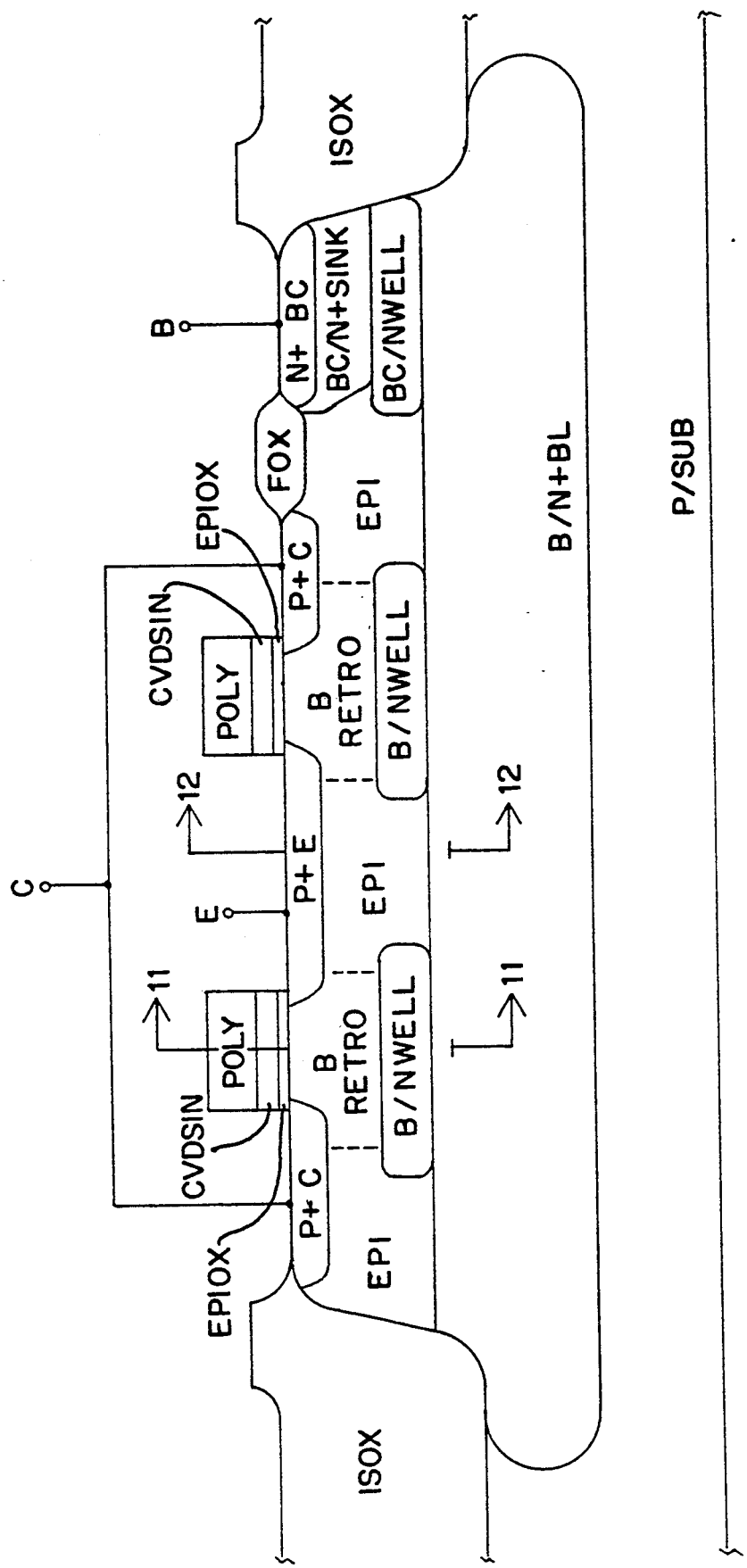
Figure 10:
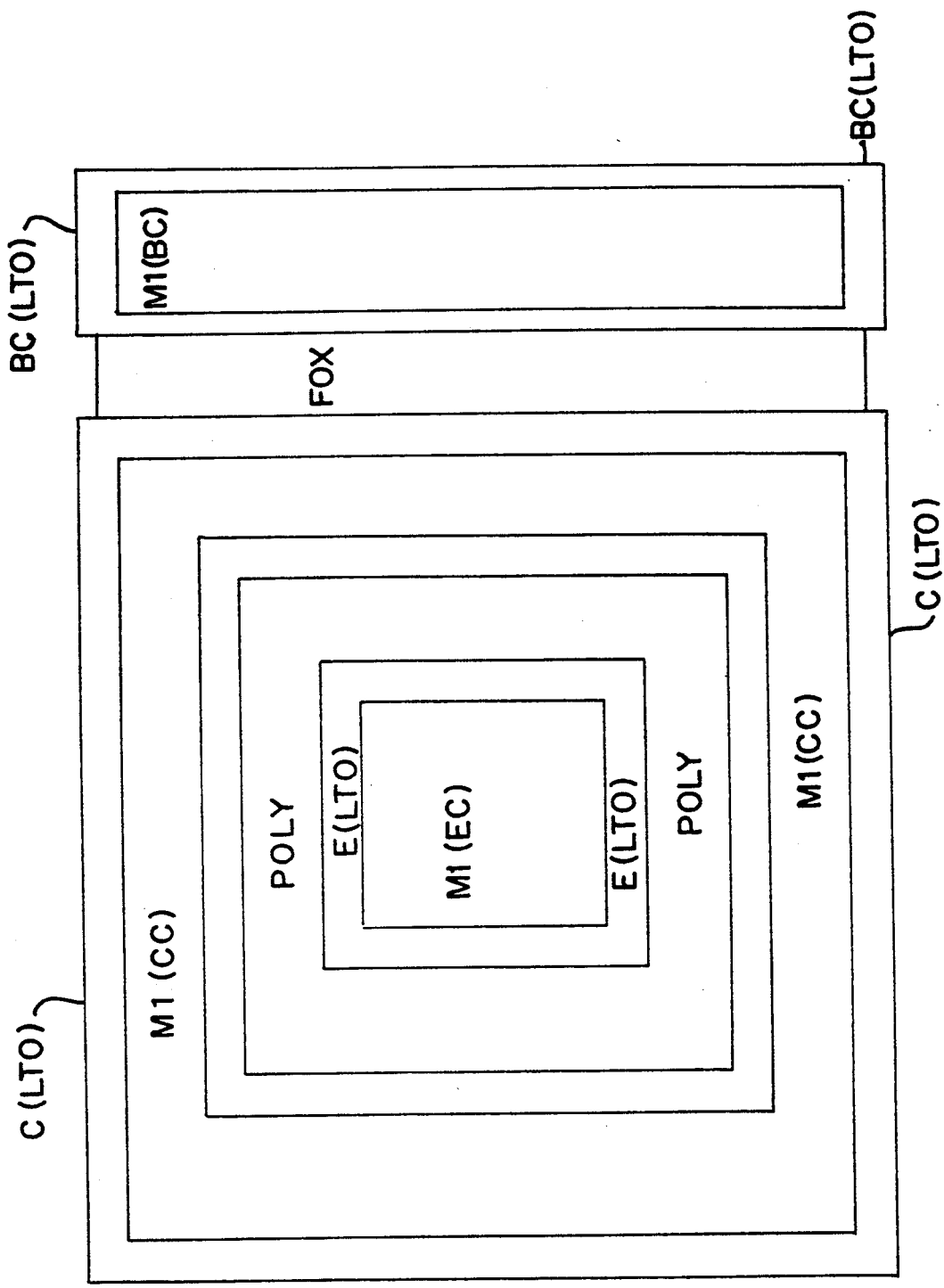
FIG. 10 is a simplified diagrammatic plan view of the layout of the lateral PNP transistor.
Figure 12:
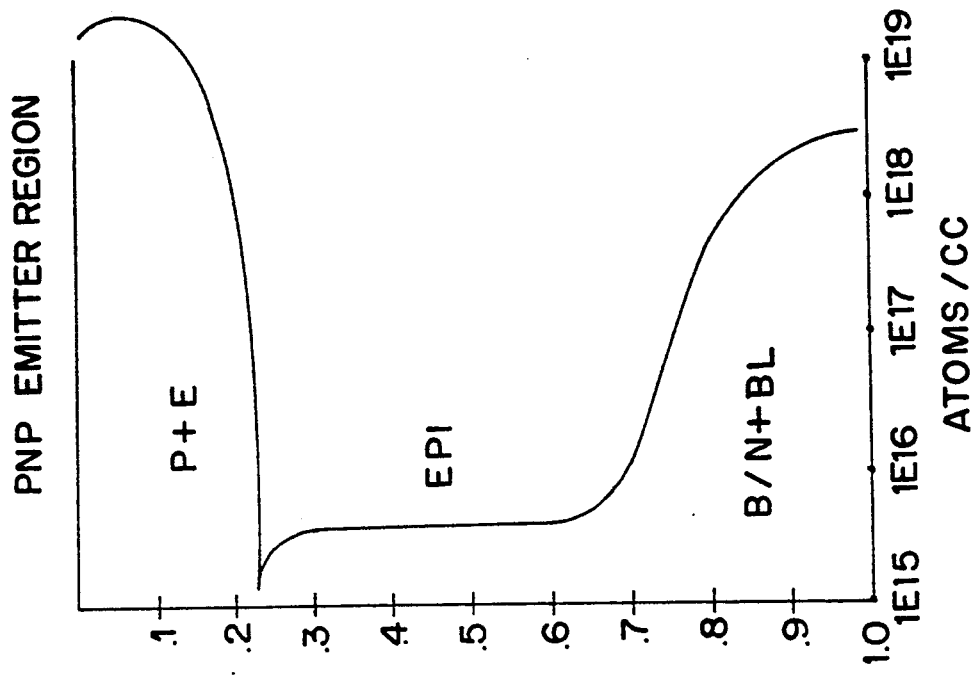
FIGS. 11 and 12 are simplified graphs of carrier concentration through the lateral PNP transistor base region and emitter region respectively in the direction of the arrows on respective lines 11—11 and 12—12 of FIG. 9.
Figure 11:
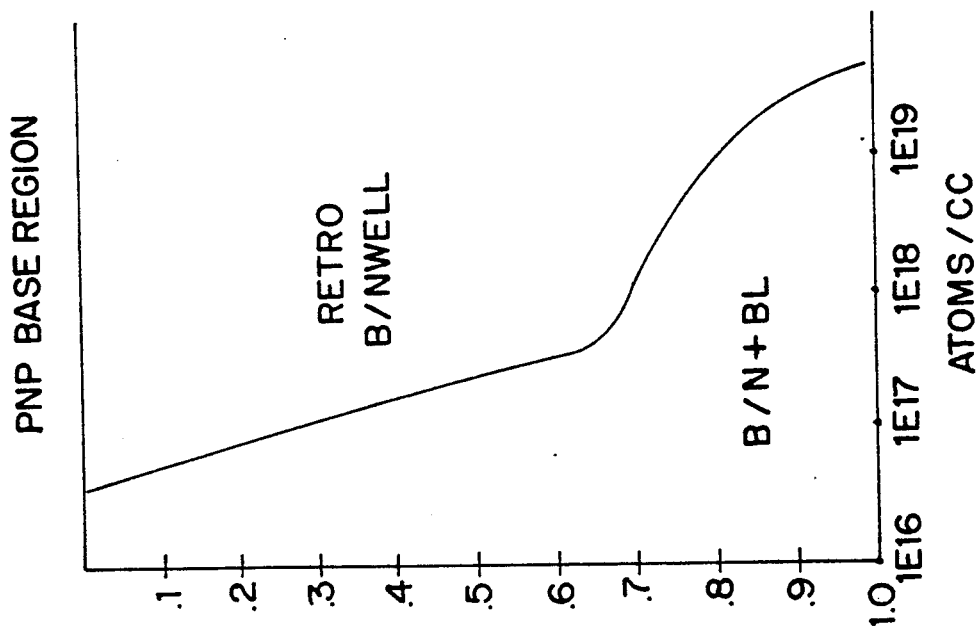

The graphs of FIG. 11 and FIG. 12 show the advantageous concentration profile of dopant atoms in the vertical direction through the lateral PNP transistor structure between lines 11—11 and 12—12 respectively in FIG. 9. FIG. 11 illustrates how the retro grade concentration of N type atoms RETRO in the active base region compensates for the low concentration of carriers in the epitaxial layer EPI for enhancing transistor action. On the other hand FIG. 12 illustrates the low concentration of carriers in the undoped or background doped EPI which greatly reduces parasitic capacitance with the base N+ buried layer B/N+BL in the non active regions of the EPI.

While the invention has been described with reference to particular example embodiments it is intended to cover all modifications and equivalents within the scope of the following claims.

We claim:

1. A method of forming a lateral PNP transistor in a substrate of semiconductor material during a BICMOS process for fabricating bipolar NPN transistors and CMOS transistors including PMOS transistors and NMOS transistors in a BICMOS integrated circuit, said method comprising:

forming a base N+ buried layer in the IC substrate to underlie a bipolar PNP transistor during an N type buried layer mask, etch and N type introduction sequence used to form a buried collector layer in the semiconductor material substrate to underlie NPN transistors of the BICMOS IC;

forming a PNP base Retro NWELL and a PNP base contact Retro NWELL in the base N type buried layer to underlie the active base region and base contact region respectively of the bipolar PNP transistor during a Retro NWELL mask, etch and N type introduction sequence used to form Retro NWELLs in the IC substrate to underlie PMOS transistors of the BICMOS IC;

growing an epitaxial layer in the range from undoped to low doped EPI across the IC substrate including the area for the PNP transistor;

forming a PNP base contact N+ sink region over the base contact NWELL during a sink definition mask, etch and N type introduction sequence of the BICMOS process used to form an NPN collector sink region through the epitaxial layer to a buried collector layer for bipolar NPN transistors;

separating the PNP base contact N+ sink region from a collector region of the PNP transistor by field oxide during an active area definition mask, etch and grow sequence of the BICMOS process used for framing CMOS transistors in field oxide and isolating PMOS and NMOS transistors with field oxide;

forming the collector and emitter regions of the bipolar PNP transistor using at least one of an NPN base definition mask, etch and P type introduction sequence of the BICMOS process used to form a base region of bipolar NPN transistors, and a P+S/D mask definition, etch and P type introduction sequence of the BICMOS process used to form the source and drain of PMOS transistors and to enhance the base region of bipolar NPN transistors;

and forming metal contacts to the collector, emitter and base contact regions of the PNP transistors; thereby forming the lateral PNP transistor using the steps of the BICMOS process for fabricating NPN and CMOS transistors without adding additional steps.

2. The method of claim 1 comprising:

depositing a uniform layer of polycrystalline semiconductor material across the integrated circuit after the field oxide definition mask, etch and grow sequence;

forming a PNP base width definition self aligned transistor mask of POLY using the POLY definition mask and etch sequence;

and forming the collector and emitter regions of the bipolar PNP transistor using at least one of the NPN base definition mask, etch and P type introduction sequence or the PMOS P+S/D mask definition, etch and P type introduction sequence, and introducing the P type material through the POLY self aligned transistor mask openings for defining the base width and active base region between the collector and emitter regions.

3. The method of claim 2 comprising:

forming a base contact region of the PNP transistor using the NPN emitter definition mask, etch and N type introduction sequence after forming the PNP collector and emitter regions.

4. The method of claim 3 comprising:

forming the collector and emitter regions of the bipolar PNP transistor using both the NPN base definition mask, etch and P type introduction sequence and the PMOS P+S/D mask definition, etch and P type introduction sequence, introducing the P type material through the POLY self aligned transistor mask openings for defining the base width and active base region between the collector and emitter regions.

5. The method of claim 2 wherein the POLY self aligned transistor mask performs a nonelectrical mask function only for defining the base width and the active base region.

6. The method of claim 1 comprising:

growing an epitaxial layer of low doped EPI across the IC substrate in the concentration range of 1—3E15/cc.

7. The method of claim 1 wherein the BICMOS process comprises an active strip mask, etch, $V_T$ adjust and gate oxide grow sequence for preparing the active area of CMOS transistors after the active area definition mask, etch, and grow sequence, comprising:

masking and covering the active area of the lateral PNP transistor comprising the emitter, base, collector and base contact N+ sink regions of the PNP transistor during said active strip mask, etch, $V_T$ adjust and gate oxide grow sequence.

8. The method of claim 7 comprising:

growing an epitaxial oxide layer across the epitaxial layer after growing the uniform epitaxial layer EPI over the IC substrate;

depositing a silicon nitride layer by chemical vapor deposition over the epitaxial oxide layer before the active area definition or field oxide definition mask, etch, and grow sequence;

and preserving the silicon nitride layer across the active areas of the lateral PNP transistor including the collector, base, emitter and base contact N+ sink regions during the active strip mask, etch, $V_T$ adjust and gate oxide grow sequence.

9. The method of claim 8 comprising:

depositing a uniform layer of polycrystalline semiconductor material across the integrated circuit after the active strip mask, etch, V$_T$ adjust and gate oxide grow sequence;

and forming a PNP base width definition and active base region definition self aligned transistor mask of POLY using the POLY definition mask and etch sequence.nd etch sequence.

10. A method of forming a lateral PNP transistor in a substrate of semiconductor material during a BICMOS process for fabricating bipolar NPN transistors and CMOS transistors including PMOS transistors and NMOS transistors in a BICMOS integrated circuit, said BICMOS process including an N type buried layer mask, etch and N type introduction sequence for forming a buried collector layer in a semiconductor material substrate to underlie bipolar NPN transistors of the BICMOS IC, a Retro NWELL mask, etch and N type introduction sequence for forming Retro NWELLs in the IC substrate to underlie PMOS transistors of the BICMOS IC, growing an epitaxial layer of semiconductor material over the IC substrate, a sink definition mask, etch and N type introduction sequence for forming a collector sink region through the epitaxial layer to the buried collector layer for bipolar NPN transistors, an active area definition or field oxide definition mask, etch, and grow sequence for framing CMOS transistors in field oxide and spacing PMOS and NMOS transistors with field oxide, depositing a uniform layer of polycrystalline semiconductor material over the BICMOS integrated circuit, a poly definition mask and etch sequence for forming poly gates over the CMOS transistors of the BICMOS IC, and NPN base definition mask, etch and P type sequence introduction sequence for forming the base region of bipolar NPN transistors of the BICMOS IC, a contact definition mask and etch sequence for removing the CVD nitride layer in the collector, base, and emitter contact areas of bipolar NPN transistors of the BICMOS IC and forming self aligned transistors masks across the bipolar NPN transistors, and NPN emitter definition mask, etch and N type introduction sequence for forming the emitter regions and enhancing the collector regions of bipolar NPN transistors of the BICMOS IC, and P+ source drain mask, etch and P type introduction sequence for forming the source and drain of PMOS transistors and enhancing the base region of bipolar NPN transistors, and further contact definition and metal definition mask, etch and deposition sequences for forming metal contacts and metal leads with the electrodes of the bipolar NPN and CMOS PMOS and NMOS transistors, said method comprising:

forming a base N type buried layer in the IC substrate to underlie the bipolar PNP transistor during the N+BL mask, etch and N type introduction sequence;

forming a PNP base Retro NWELL and a PNP base contact Retro NWELL in the base N type buried layer to underlie the active base region (B) and base contact region respectively of the bipolar PNP transistor using the Retro NWELL mask, etch and N type introduction sequence;

growing an epitaxial layer in the range from undoped to low doped EPI across the IC substrate and forming retrograde concentrations of N type material upward from the respective B/NWELL and BC/NWELL into the epitaxial layer;

forming a base contact N+ sink region over the base contact NWELL in the epitaxial layer using the sink definition mask, etch and N type introduction sequence;

separating the base contact N+ sink region from a collector region of the PNP transistor by field oxide using the active area definition mask, etch and grow sequence;

forming the collector and emitter regions of the bipolar PNP transistor using at least one of the NPN base definition mask, etch and P type introduction sequence or the PMOS P+S/D mask definition, etch and P type introduction sequence;

and forming metal contacts to the collector, emitter and base contact regions of the PNP transistor;

thereby forming the lateral PNP transistor using the steps of the BICMOS process for fabricating NPN and CMOS transistors without adding additional steps.

11. The method of claim 10 comprising:

depositing a uniform layer of polycrystalline semiconductor material across the integrated circuit after the field oxide definition mask, etch and grow sequence;

forming a PNP base width definition and active base region definition self aligned transistor mask of POLY using the POLY definition mask and etch sequence;

and forming the collector and emitter regions of the bipolar PNP transistor using at least one of the NPN base definition mask, etch and P type introduction sequence and the PMOS P+S/D mask definition, etch and P type introduction sequence and introducing the P type material through the POLY self aligned transistor mask openings for defining the PNP base width and active base region between the collector and emitter regions.

12. The method of claim 11 comprising:

forming a base contact region of the PNP transistor using the NPN emitter definition mask, etch and N type introduction sequence after forming the collector and emitter regions.

13. The method of claim 11 comprising:

forming the collector and emitter regions of the bipolar PNP transistor using both the NPN base definition mask, etch and P type introduction sequence and the PMOS P+S/D mask definition, etch and P type introduction sequence, introducing the P type material through the POLY self aligned transistor mask openings for defining the PNP base width and active base region between the collector and emitter regions.

14. The method of claim 11 wherein the POLY self aligned transistor mask performs a nonelectrical mask function only for defining the PNP base width and the active base region.

15. The method of claim 11 wherein the POLY self aligned transistor mask defining the base width and active base region of the PNP transistor is electrically tied to the emitter region of the PNP transistor for field plating.

16. The method of claim 11 wherein the lateral PNP transistor is formed in a concentric configuration with the collector region in the configuration of an outer annulus, the active base region is formed in the configuration of a middle annulus inside the collector region, wherein the emitter region is formed in the configuration of an area inside the middle annulus of the base region, and wherein the base contact and base contact sink region are formed outside the collector region.

17. The method of claim 10 comprising:
growing an epitaxial layer of low doped EPI across the IC substrate in the concentration range of 1–3E15/cc.

18. The method of claim 10 wherein the BICMOS process comprises an active strip mask, etch, $V_T$ adjust and gate oxide grow sequence for preparing the active area of CMOS transistors after the active area definition mask, etch, and grow sequence, comprising:
masking and covering the active area of the lateral PNP transistor comprising the emitter, base, collector and base contact N+ sink regions of the PNP transistor during said active strip mask, etch, $V_T$ adjust and gate oxide grow sequence.

19. The method of claim 18 comprising:
growing an epitaxial oxide layer across the epitaxial layer after growing the uniform epitaxial layer EPI over the IC substrate;
depositing a silicon nitride layer by chemical vapor deposition over the epitaxial oxide layer before the active area definition mask, etch, and grow sequence;
and preserving the silicon nitride layer across the active areas of the lateral PNP transistor including the collector, base, emitter and base contact N+ sink regions during the active strip mask, etch, $V_T$ adjust and gate oxide grow sequence.

20. The method of claim 16 comprising:
depositing a uniform layer of polycrystalline semiconductor material across the integrated circuit after the active strip mask, etch, $V_T$ adjust and gate oxide grow sequence;
and forming a PNP base width definition and active base region definition self aligned transistor mask of POLY using the POLY definition mask and etch sequence.

* * * * *